United States Patent
Yim et al.

(10) Patent No.: US 9,035,308 B2
(45) Date of Patent: May 19, 2015

(54) SEMICONDUCTOR PACKAGE AND METHOD OF FABRICATING THE SAME

(71) Applicant: Samsung Electronics Co., Ltd., Suwon-si, Gyeonggi-do (KR)

(72) Inventors: Choongbin Yim, Cheonan-si (KR); Hyeongmun Kang, Seoul (KR); Taesung Park, Cheonan-si (KR); Eunchul Ahn, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/197,203

(22) Filed: Mar. 4, 2014

(65) Prior Publication Data

US 2014/0374883 A1  Dec. 25, 2014

(30) Foreign Application Priority Data

Jun. 25, 2013  (KR) .................. 10-2013-0073235

(51) Int. Cl.
*H01L 23/58*  (2006.01)
*G01R 31/26*  (2014.01)
*H01L 23/544*  (2006.01)
*H01L 21/3105*  (2006.01)

(52) U.S. Cl.
CPC .......... *H01L 23/544* (2013.01); *H01L 21/3105* (2013.01)

(58) Field of Classification Search
CPC . B82Y 30/00; G06K 19/06037; G06K 1/121; H04N 2201/3269
USPC .................. 438/14, 15, 18, 401; 257/48, 797; 235/438, 441, 462.11, 494, 495
See application file for complete search history.

(56) References Cited

U.S. PATENT DOCUMENTS

| 7,999,368 B2 | 8/2011 | Yim et al. |
| 2004/0188860 A1 | 9/2004 | Tsai et al. |
| 2007/0176305 A1* | 8/2007 | Sasaki .......................... 257/797 |
| 2008/0179761 A1 | 7/2008 | Ano |
| 2010/0078791 A1 | 4/2010 | Yim et al. |
| 2010/0175912 A1 | 7/2010 | Shih |
| 2012/0290117 A1 | 11/2012 | Wang et al. |

FOREIGN PATENT DOCUMENTS

| JP | H0541414 A | 2/1993 |
| JP | H0547946 A | 2/1993 |
| JP | H05121497 A | 5/1993 |
| JP | H09120999 A | 5/1997 |
| JP | H09300598 A | 11/1997 |
| JP | H1070207 A | 3/1998 |
| JP | H10178119 A | 6/1998 |
| JP | 2001267380 A | 9/2001 |
| JP | 2007059450 A | 3/2007 |
| JP | 2009064824 A | 3/2009 |

(Continued)

*Primary Examiner* — Hsien Ming Lee
(74) *Attorney, Agent, or Firm* — Renaissance IP Law Group LLP

(57) ABSTRACT

A semiconductor package, comprising: a semiconductor substrate; a mold layer on the semiconductor substrate; and a marking formed on a surface of the mold layer, the marking comprising dot markings substantially discontinuously arranged in vertical and horizontal directions of a display region. An effective area of the dot markings within a unit display region of the marking is smaller than about half a total area of the unit display region.

20 Claims, 14 Drawing Sheets

(56) References Cited

FOREIGN PATENT DOCUMENTS

| | | |
|---|---|---|
| JP | 2009105210 A | 5/2009 |
| JP | 2010165734 A | 7/2010 |
| JP | 2011066140 A | 3/2011 |
| JP | 2011129617 A | 6/2011 |
| JP | 2012192539 A | 10/2012 |
| KR | 100175269 | 4/1999 |
| KR | 100235753 B1 | 12/1999 |
| KR | 100449865 B1 | 9/2004 |
| KR | 20040079616 A | 9/2004 |
| KR | 20100101458 A | 9/2010 |

* cited by examiner

US 9,035,308 B2

SEMICONDUCTOR PACKAGE AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0073235, filed on Jun. 25, 2013, in the Korean Intellectual Property Office, the entire contents of which are hereby incorporated by reference.

BACKGROUND

Embodiments relate to a semiconductor package and a method of fabricating the same, and in particular, to a semiconductor package with embossed dot markings and a method of fabricating the same.

As a semiconductor fabrication technology advances, a variety of semiconductor packages have been commercialized. The semiconductor package may have markings that are carved on a mold layer to display information on a manufacturer, a lot number, a product number, or a trademark of a semiconductor package. The carved markings may be formed on a surface of the mold layer by a laser beam.

SUMMARY

An embodiment includes a semiconductor package, comprising: a semiconductor substrate; a mold layer on the semiconductor substrate; and a marking formed on a surface of the mold layer, the marking comprising dot markings substantially discontinuously arranged in vertical and horizontal directions of a display region. An effective area of the dot markings within a unit display region of the marking is smaller than about half a total area of the unit display region.

Another embodiment includes a method of fabricating a semiconductor package, comprising: printing dot markings of a marking on a mold layer on a semiconductor substrate. The dot markings in a unit display region within the marking have an effective area that is smaller than about half a total area of the unit display region.

Another embodiment includes a semiconductor package, comprising: a semiconductor substrate; a mold layer formed on the semiconductor substrate; and a display region on the mold layer including a marking formed of dot markings. The display region includes dot regions and non-dot regions; the dot markings of the marking are formed outside of the non-dot regions; and a ratio of an effective area of the dot regions within a unit display region of the display region to an area of the unit display region is less than about one half.

BRIEF DESCRIPTION OF THE DRAWINGS

Embodiments will be more clearly understood from the following brief description taken in conjunction with the accompanying drawings. The accompanying drawings represent non-limiting embodiments as described herein.

DETAILED DESCRIPTION

Figure 1:
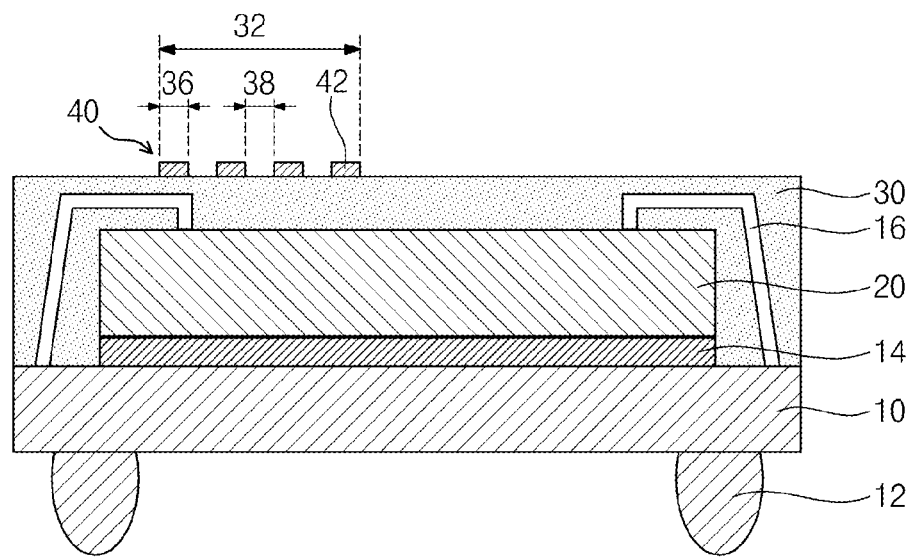
FIG. 1 is a sectional view illustrating a semiconductor package according to some embodiments.

Embodiments will now be described more fully with reference to the accompanying drawings, in which particular embodiments are shown. Some embodiments may, however, take many different forms and should not be construed as being limited to the particular embodiments set forth herein; rather, these embodiments are provided so that this disclosure will be thorough and complete, and will fully convey the concept to those of ordinary skill in the art. In the drawings, the thicknesses of layers and regions are exaggerated for clarity. Like reference numerals in the drawings denote like elements, and thus their description will be omitted.

It should be noted that the figures are intended to illustrate the general characteristics of methods, structure and/or materials utilized in certain some embodiments and to supplement the written description provided below. These figures are not, however, to scale and may not precisely reflect the precise structural or performance characteristics of any given embodiment, and should not be interpreted as defining or limiting the range of values or properties encompassed by some embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of some embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of other embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a sectional view illustrating a semiconductor package according to some embodiments. Referring to FIG. 1, a semiconductor package may include a printed circuit board 10, a semiconductor chip 20, a mold layer 30, and a marking 40. The printed circuit board 10 may be mounted on the semiconductor chip 20. An under-fill epoxy 14 may be provided between the semiconductor chip 20 and the printed circuit board 10. The semiconductor chip 20 may be electrically connected to the printed circuit board 10 via bonding wires 16. The bonding wires 16 may be coupled or bonded to an edge region of the semiconductor chip 20. The printed circuit board 10 may have an area greater than that of the semiconductor chip 20. The bonding wires 16 may be connected to a region of the printed circuit board 10 exposed by the semiconductor chip 20. Alternatively, the printed circuit board 10 and the semiconductor chip 20 may be electrically connected to each other using a flip-chip bonding method. For example, in the flip-chip bonding method, bumps (not shown) may be provided between the semiconductor chip 20 and the printed circuit board 10. Solder bumps 12 may be provided below the printed circuit board 10. The solder bumps 12 may be electrically connected to the semiconductor chip 20 through the printed circuit board 10.

The semiconductor chip 20 may include a memory chip, a system LSI chip, a solid state drive, or other devices. Although not shown, a plurality of the semiconductor chips 20 may be disposed to form a stack. The stack of the semiconductor chips 20 may be electrically connected to each other using a through-silicon via (TSV), the bonding wires 16, or other interconnection structures. In some embodiments, if the semiconductor package is in the form of a wafer-level semiconductor package, the semiconductor chip 20 may be enclosed by the mold layer 30, without the printed circuit board 10.

The mold layer 30 may encapsulate or cover the semiconductor chip 20. The semiconductor chip 20 may be protected by the mold layer 30. The mold layer 30 may include a black or gray thermally-curable polymer compound; however, other compounds may be used. The bonding wire 16 and the under-fill epoxy 14 may be buried by the mold layer 30. The marking 40 may be provided on the mold layer 30. As a size of the semiconductor package decreases, a thickness of the mold layer 30 may decrease. However, the conventional engraving marking has a limitation, due to the decrease in thickness of the mold layer 30. For example, if the engraving marking is applied to a thin mold layer, a technical problem, such as low visibility, may occur.

Figure 2:
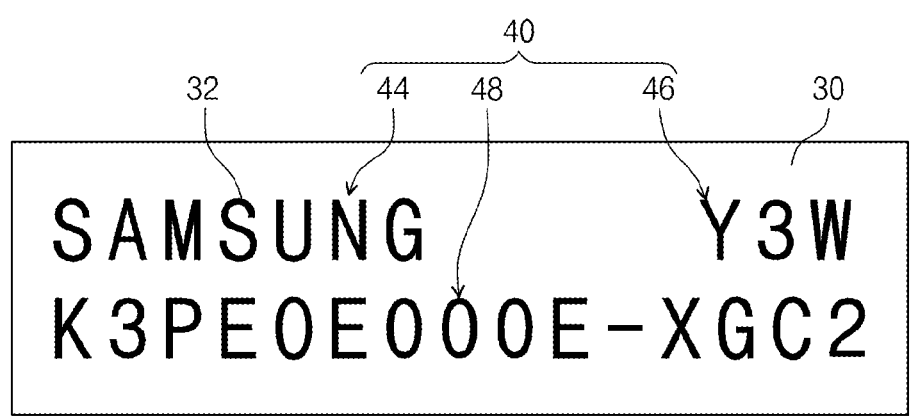
FIG. 2 is a plan view of FIG. 1.

FIG. 2 is a plan view of the mold layer 30 and the marking 40 of FIG. 1. Referring to FIGS. 1 and 2, the marking 40 may include dot markings 42 that are formed on the mold layer 30 in an embossed manner. The embossed dot markings 42 may be suitable for a mold layer 30 having a smaller thickness and thereby be used as an alternative to the conventional engraving-fashioned markings. The dot markings 42 may be collectively arranged on a display region 32 of the mold layer 30 to display a letter, a trademark, a symbol, and so forth. Here, the display region 32 may be defined as a region, on which the marking 40, such as a letter or a trademark, will be formed. The marking 40 may have at least one of colors (e.g., white or yellow) having high visibility with respect to the background color (e.g., black). Although particular colors have been used as examples, other marking 40 colors that have a higher contrast with a background color may be used. The marking 40 may include a manufacturer marking 44, a lot number marking 46, a serial number marking 48, or other information. The manufacturer marking 44 may display information on a maker or manufacturer of the semiconductor package. The lot number marking 46 may display information on production of products. The serial number marking 48 may display information on type or performance of products. In some embodiments, the manufacturer marking 44, the lot number marking 46, and the serial number marking 48 may be displayed by letters, trademark, or symbol with substantially the same line width.

Figure 3:
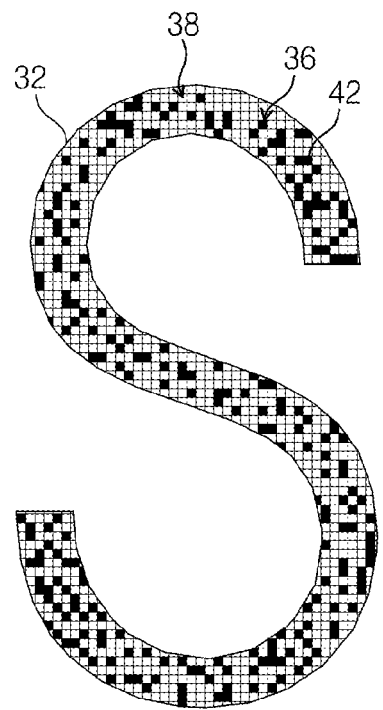
FIG. 3 is an enlarged view of a display region of FIG. 2.

FIG. 3 is an enlarged view of the display region 32 of FIG. 2. The display region 32 may include a dot region 36 and a non-dot region 38. The dot region 36 may be a region of the display region 32, in which the dot markings 42 are formed, and the non-dot region 38 may be a part of the display region 32, in which the dot markings 42 are not formed. The dot region 36 and the non-dot region 38 may have substantially the same size or area; however, in other embodiments, the dot region 36 and the non-dot region 38 may have different sizes or areas.

The dot markings 42 may have a thickness of about 10 μm or less. If the dot markings 42 are in contact with each other or a length of contact surfaces of the dot marking 42 increases, the marking 40 may have an increased thickness. This may lead to deterioration in reliability of the semiconductor package. Accordingly, the dot markings 42 may be configured in such a way that a contact therebetween can be minimized or reduced. The dot markings 42 may be spaced apart from or be in point contact with each other on the mold layer 30. In the display region 32, an effective area of the dot markings 42 may decrease. The effective area may mean an area of the display region 32 filled with the dot markings 42. In some embodiments, the dot markings 42 may be regularly arranged in the display region 32 with a resolution of 720×1440 dots per inch (dpi).

According to some embodiments, a ratio of the effective area of the dot markings 42 to a total area of the display region 32 may range from about ½ (50%) to about ¼ (25%). Even in such a case, the display region 32 provided in the effective area from about ½ to about ¼ can have a visibility similar to that of a display region 32 with full coverage (e.g., with an effective area ratio of 100%). The dot markings 42 may not be overlapped with each other in a small display region. A variation in thickness of the marking 40 may be smaller for the display region with a small effective area than for the display region with a large effective area. That is, as described above, when dot markings 42 are adjacent as may occur when the effective area is larger, the thickness may increase in some regions leading to a larger variation in thickness. In contrast, in some embodiments, if the dot markings 42 are disposed such that the dot markings 42 are not substantially adjacent, the dot markings 42 will have thicknesses that are substantially the same as a single dot marking 42 thickness, thus reducing variation in thickness.

Hereinafter, arrangements of the dot markings 42 having an effective area ratio from ½ to ¼ will be described with reference to FIGS. 4 through 12.

Figure 4:
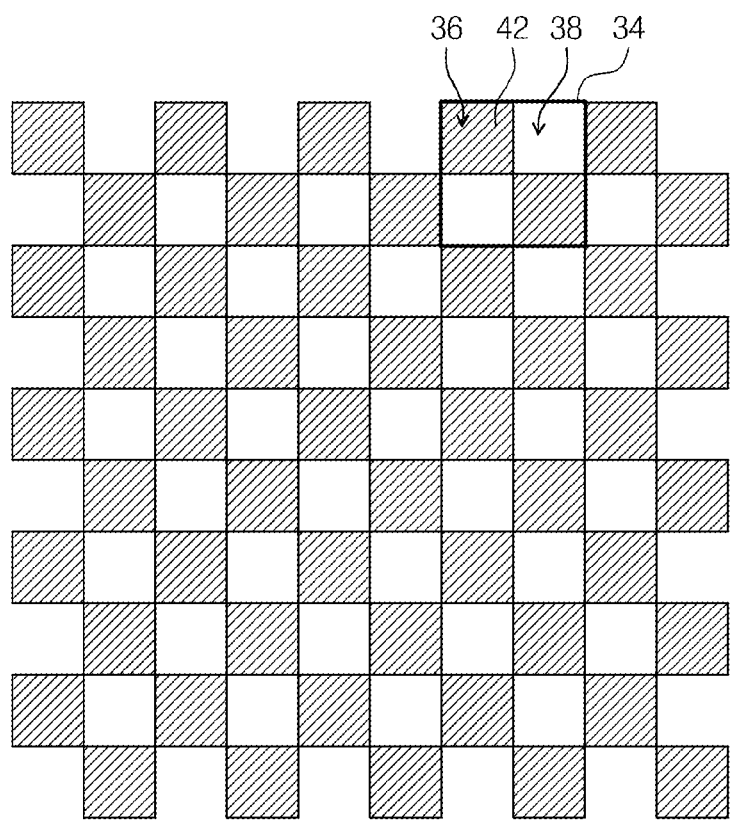
FIG. 4 is a diagram illustrating a display region according to some embodiments.

FIG. 4 is a diagram illustrating the display region 32 according to some embodiments. In a unit display region 34, the dot markings 42 may be arranged to form a plaid shape. The plaid shape may be asymmetric in vertical and horizontal directions and be symmetric in diagonal directions. Here, the diagonal direction may be a direction at an angle of about 45° to the vertical and horizontal directions. In some embodiments, a pair of the square-shaped dot regions 36 and a pair of the square-shaped non-dot regions 38 may be arranged along the diagonal directions. In certain embodiments, each of the dot markings 42 may be shaped like a square. The square-shaped dot markings 42 may not be arranged in the vertical and horizontal directions, and thus, it is possible to prevent the dot markings 42 from being in plane contact with each other. For example, the square-shaped dot markings 42 may be in point contact with each other in the diagonal direction. Although not shown, each of the dot markings 42 may be shaped like a circle, a polygon, or other different shapes. If the dot markings 42 are shaped like a circle, they may be arranged along the vertical and horizontal directions or the diagonal direction. For example, the circular dot markings 42 are arranged along the vertical and horizontal directions, they may be in point contact with each other symmetrically in the vertical and horizontal directions and spaced apart from each other in the diagonal direction. If the circular dot markings 42 are arranged spaced apart from each other in all of the vertical, horizontal, and diagonal directions or are arranged to form the plaid shape, an effective area thereof may be smaller than ¼ of the total area of the display region 32, and thus, the display region 32 may have reduced visibility.

The display region 32 may include a plurality of the unit display regions 34. Each of the unit display regions 34 may include the dot markings 42 that are regularly arranged. The unit display region 34, in which the dot markings 42 are arranged to form the plaid shape, may include two dot regions 36 and two non-dot regions 38. The dot markings 42 in the dot regions 36 may be discontinuously disposed in the vertical and horizontal directions. The dot markings 42 may be alternatingly disposed in the vertical and horizontal directions. The dot markings 42 may be continuously disposed in the diagonal direction. According to the some embodiments, an effective area ratio of the dot markings 42 to the unit display region 34 may be about 50%. In particular, in regions of the display region 32 were markings are desired, such as to form a part of a letter, symbol, trademark, or the like, the effective area ratio of the dot markings 42 may be about 50%; however, in other regions, such as where blank space is desired, the effective area ratio may be about 0%.

Figure 5:
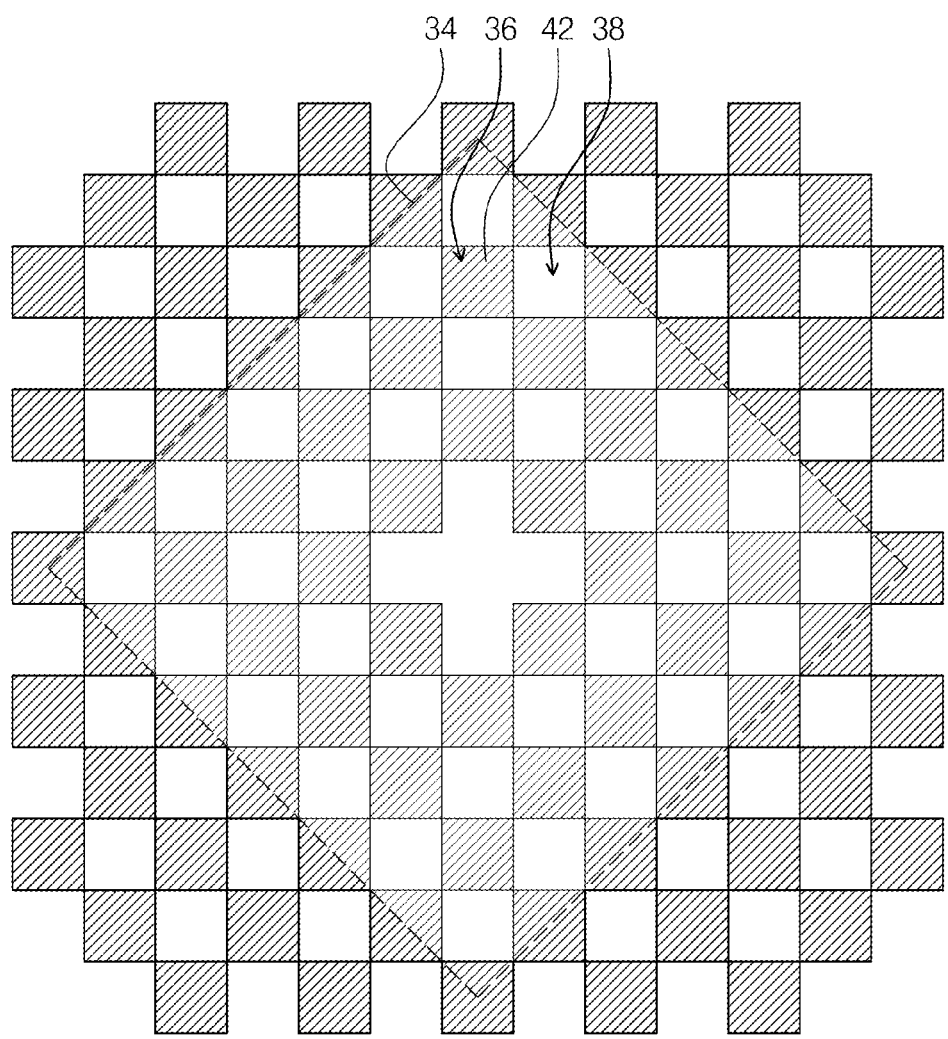
FIGS. 5 through 8 are diagrams illustrating diamond-shaped display regions, in which seven dot markings are arranged along a diagonal direction according to some embodiments.
Figure 6:
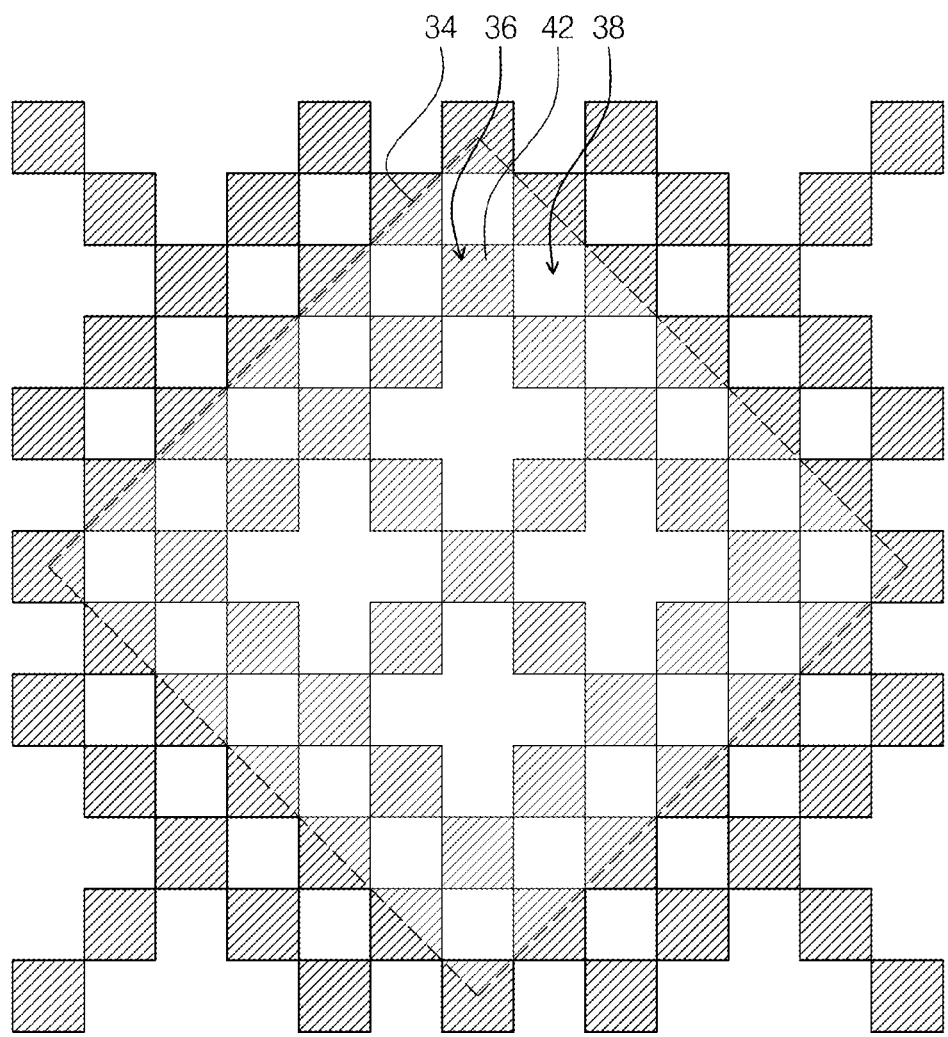
Figure 7:
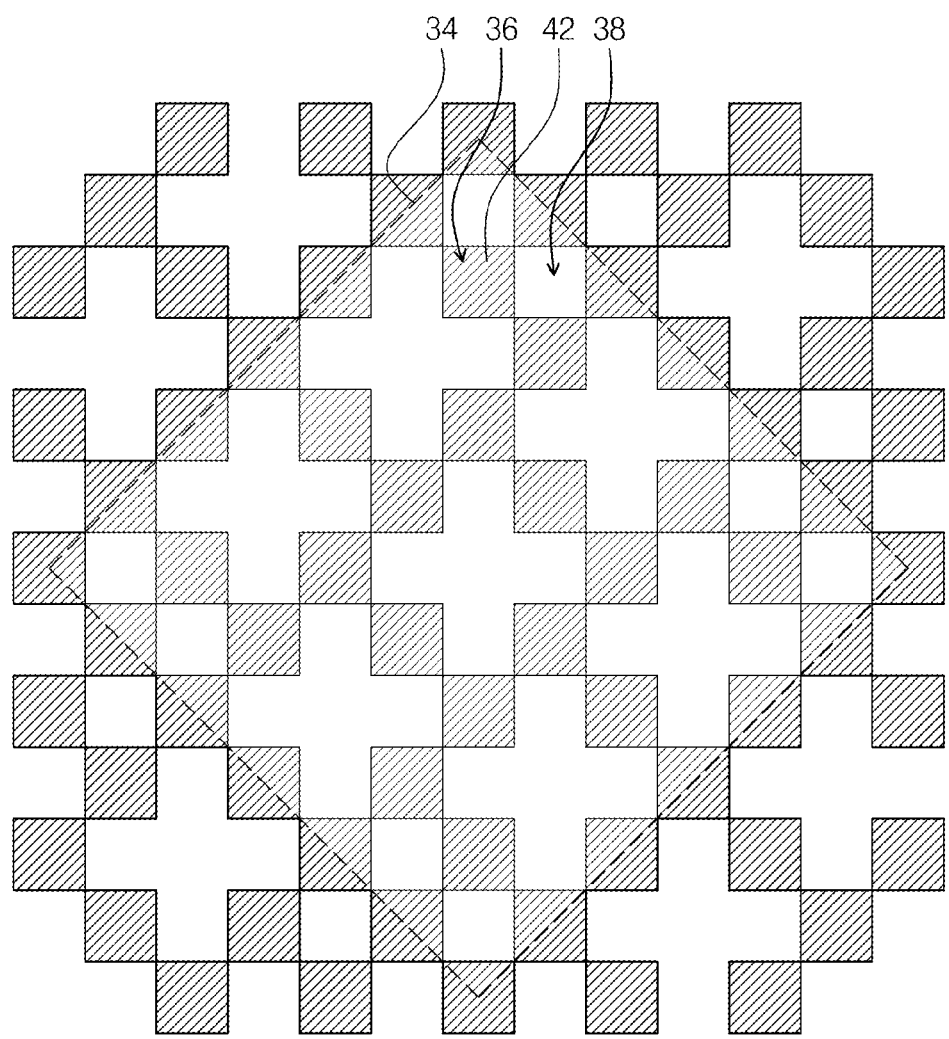

FIGS. 5 through 7 show other examples of the display region 32. In some embodiments, the unit display region 34 of the display region 32 may have a diamond shape and include seven dot markings 42 that are continuously arranged along the diagonal direction. An effective area ratio of the dot markings 42 to the display region 32 may range from about 38% to about 49%.

Referring to FIG. 5, seven dot markings 42 may be arranged along each of diagonals of the unit display region 34 having a diamond shape. The dot markings 42 may not be disposed at a center of the diamond-shaped unit display region 34. The non-dot region 38 may be positioned at the center of the diamond of the unit display region 34. This may lead to a reduction in the effective area of the unit display region 34. The effective area may correspond to a total area of the dot regions 36. The unit display region 34 may include thirty five dot regions 36 and thirty seven non-dot regions 38. Thus, in this embodiment, an effective area ratio of the dot markings 42 to the diamond-shaped unit display region 34 having an empty center may be about 49% or less.

Referring to FIG. 6, the diamond-shaped unit display region 34 may include four non-dot regions 38 that do not form the plaid shape. The dot markings 42 may be arranged to be symmetrical to each other in the diagonal direction of the unit display region 34. The unit display region 34 may include thirty two dot regions 36 and forty non-dot regions 38. Thus, in this embodiment, an effective area ratio of the dot markings 42 to the unit display region 34 may be about 44%.

Referring to FIG. 7, the diamond-shaped unit display region 34 may include seven non-dot regions 38 that do not form the plaid shape. The unit display region 34 may include twenty nine dot regions 36 and forty three non-dot regions 38. Thus, in this embodiment an effective area ratio of the dot markings 42 to the unit display region 34 may be about 40%.

Figure 8:
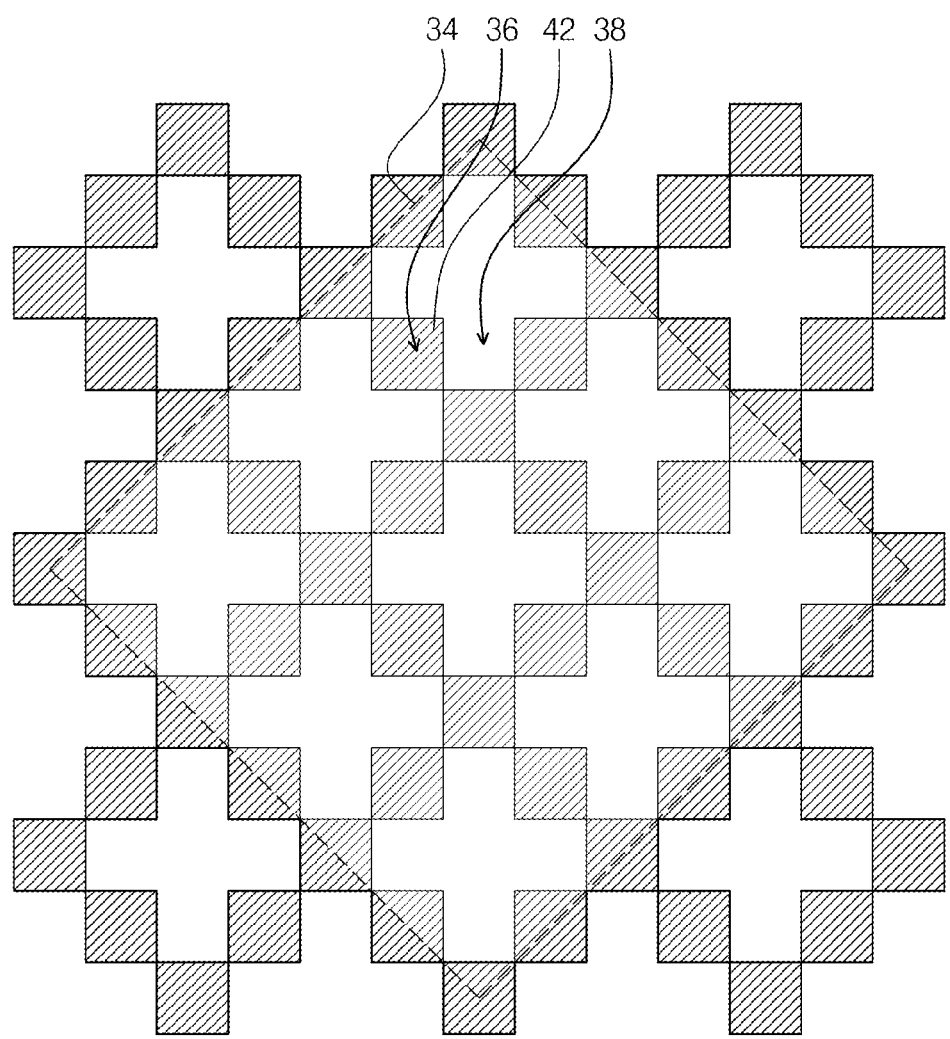

Referring to FIG. 8, the diamond-shaped unit display region 34 may include nine non-dot regions 38 that do not form the plaid shape. The unit display region 34 may include twenty seven dot regions 36 and forty five non-dot regions 38. Thus, in this embodiment, an effective area ratio of the dot markings 42 to the unit display region 34 may be about 38%.

Figure 9:
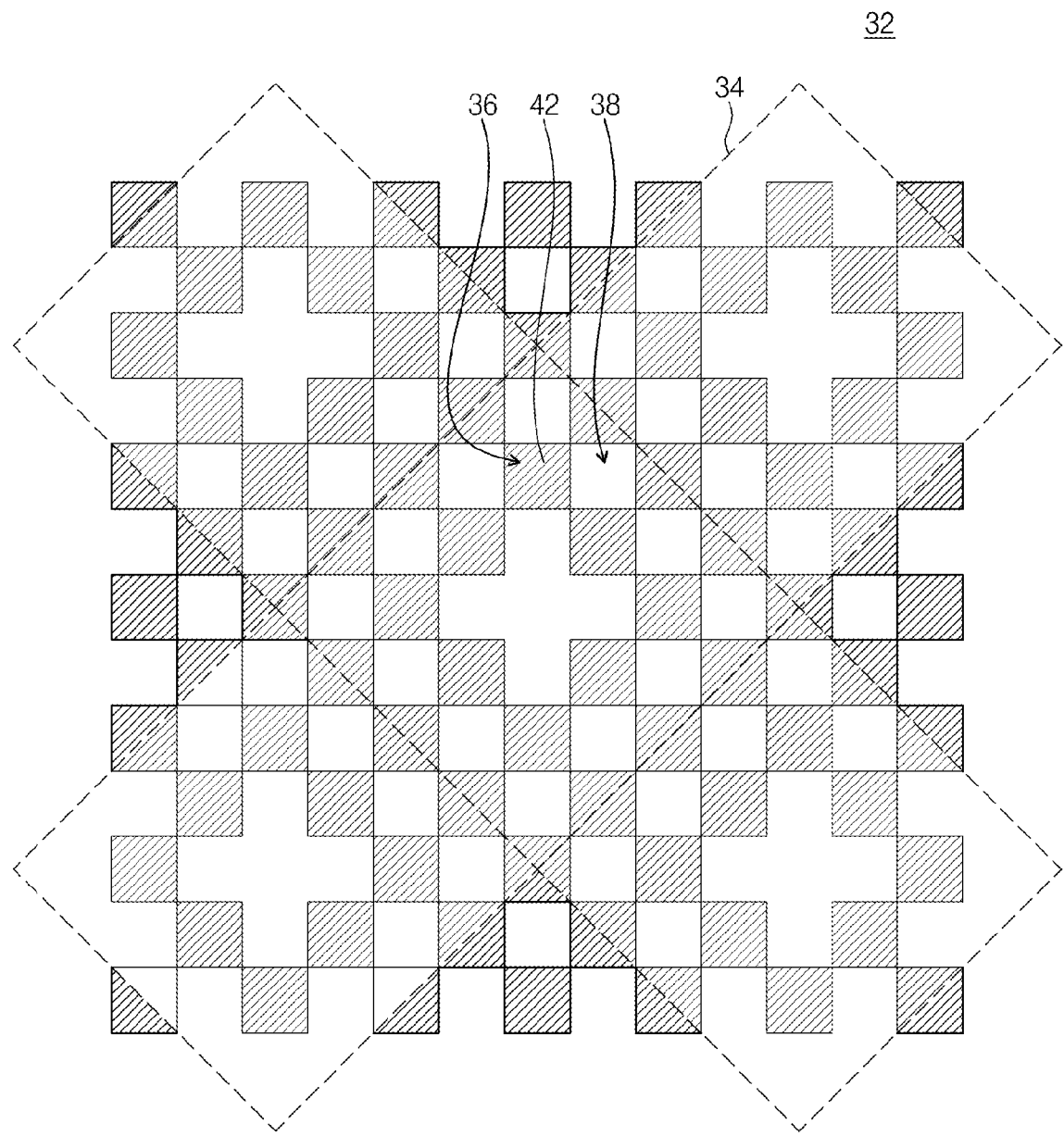
FIGS. 9 and 10 are diagrams illustrating diamond-shaped display regions, in which five dot markings are arranged along a diagonal direction according to some embodiments.
Figure 10:
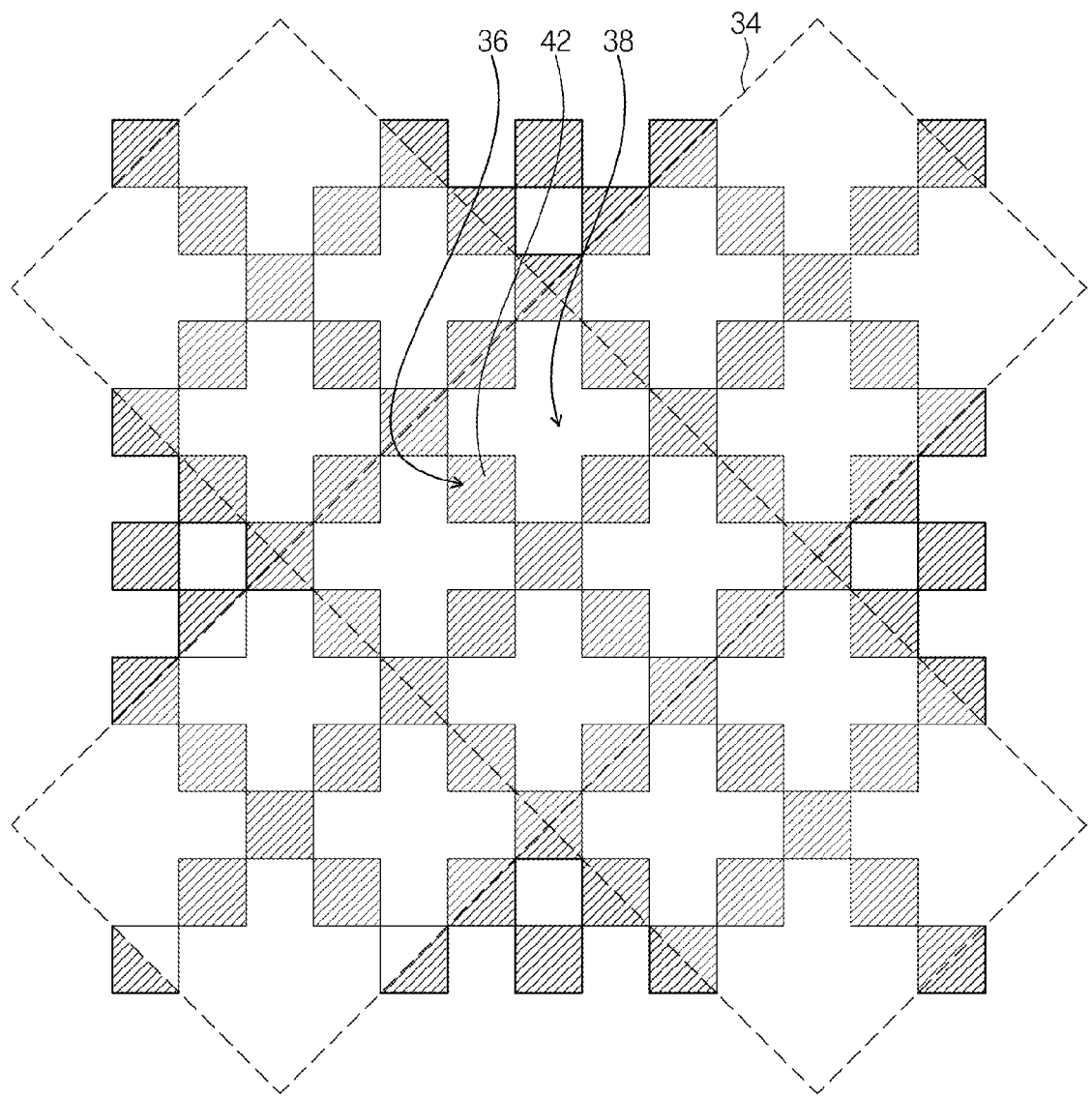

FIGS. 9 and 10 show still other examples of the display region 32. In some embodiments, the unit display region 34 may have a diamond shape and include five dot markings 42 that are continuously arranged along the diagonal direction. Thus, some embodiment, an effective area ratio of the dot markings 42 to the unit display region 34 may range from about 38% to about 47%.

Referring to FIG. 9, five dot markings 42 may be arranged along each of diagonals of the unit display region 34 having a diamond shape. For example, each of the diamond-shaped unit display regions 34 may be delimited by five dot markings 42 arranged along the diagonal directions in the dot and non-dot regions 36 and 38 arranged to form a plaid shape. The dot markings 42 may not be disposed at a center of the diamond-shaped unit display region 34. The absence of the dot marking 42 at the center of the diamond may lead to a reduction in the effective area of the unit display region 34. Thus, in this embodiment, an effective area ratio of the dot markings 42 to the unit display region 34 may be about 47% or less.

Referring to FIG. 10, the diamond-shaped unit display region 34 may include four non-dot regions 38 that do not form the plaid shape. The unit display regions 34 may include twelve dot regions 36 and twenty non-dot regions 38. Thus, in this embodiment, an effective area ratio of the dot markings 42 to the unit display region 34 may be about 38%.

Figure 11:
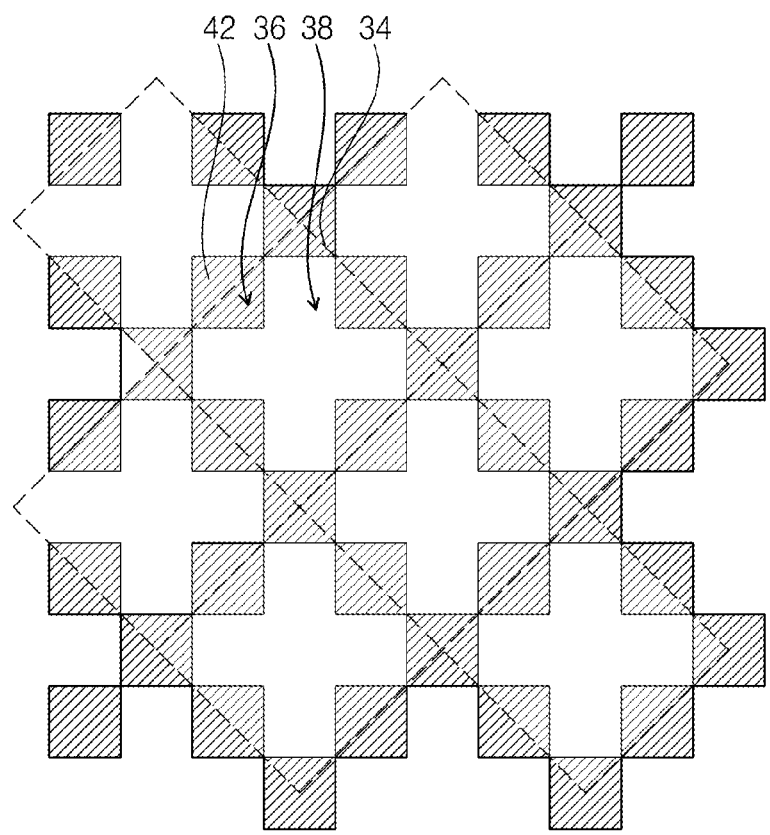
FIG. 11 is a diagram illustrating diamond-shaped display regions, in which three dot markings are arranged along a diagonal direction according to some embodiments.

FIG. 11 shows even other example of the display region 32. According to the present embodiments, three dot markings 42 may be continuously arranged along each of outer diagonals of the diamond-shaped unit display region 34. The unit display region 34 may include three dot regions 36 and five non-dot regions 38. Thus, in this embodiment, an effective area ratio of the dot markings 42 to the unit display region 34 may be about 38%.

Figure 12:
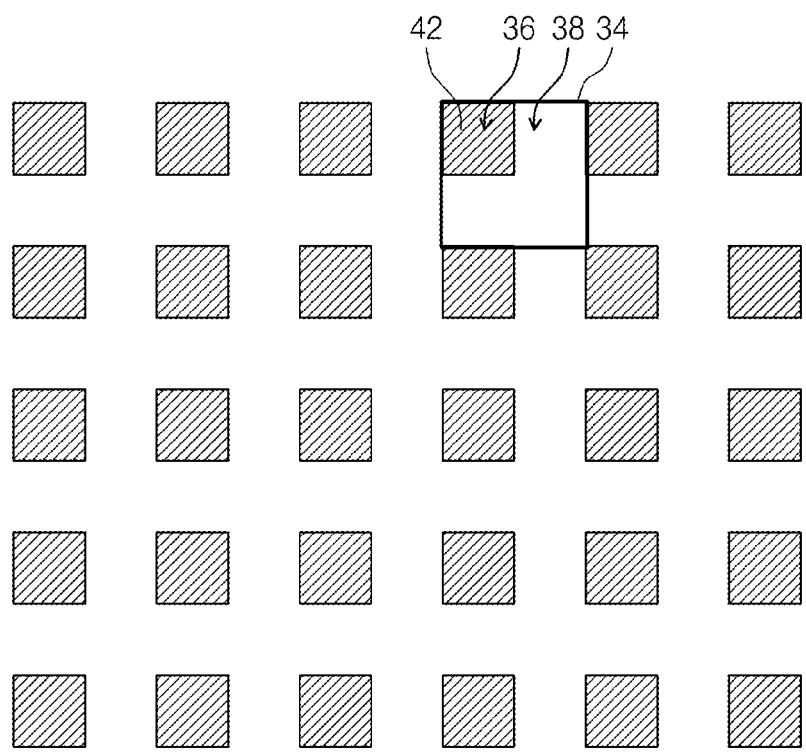
FIG. 12 is a diagram illustrating a display region, in which dot markings are regularly arranged along vertical, horizontal, and diagonal directions according to some embodiments.

FIG. 12 shows yet other example of the display region 32. The unit display region 34 may include one dot region 36 and three non-dot regions 38. The dot markings 42 may be discontinuously arranged in the vertical, horizontal, and diagonal directions. For example, the dot markings 42 may be alternatingly disposed in the vertical, horizontal, and diagonal directions. Thus, in this embodiment, an effective area ratio of the dot markings 42 to the unit display region 34 may be about 25%.

Figure 13:
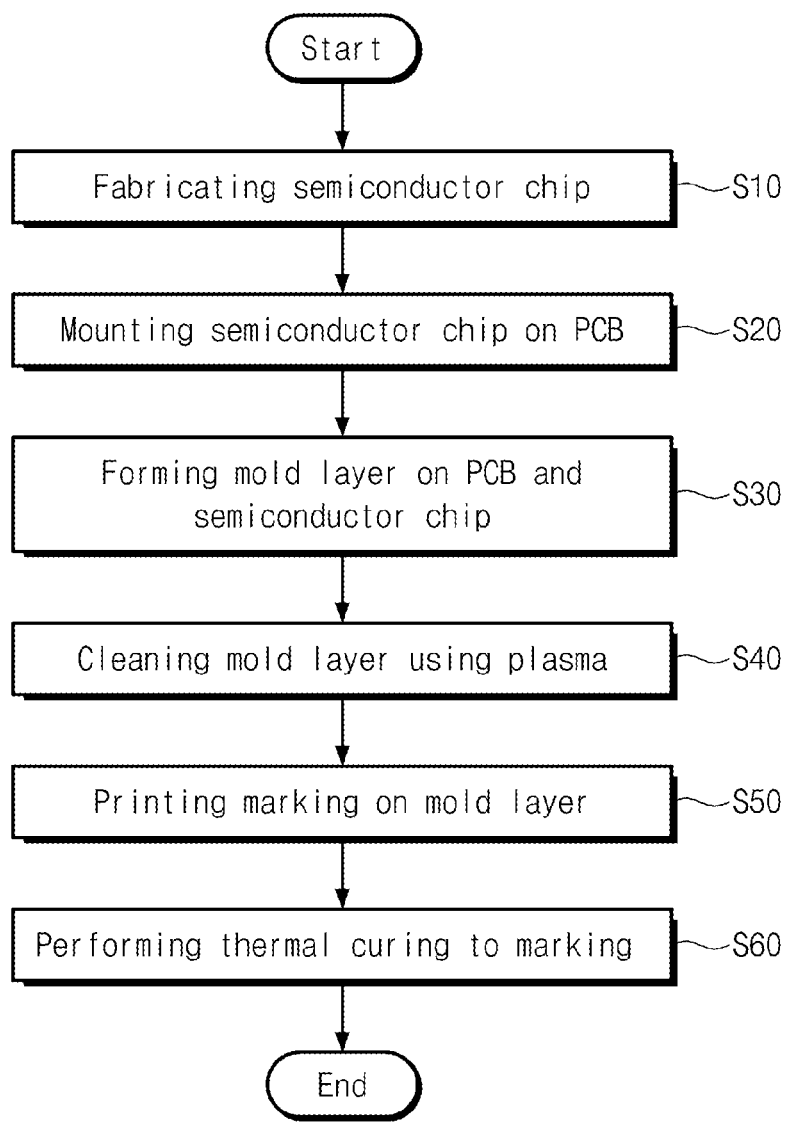
FIG. 13 is a flow chart illustrating a method of fabricating a semiconductor package according to some embodiments.

FIG. 13 shows a method of fabricating a semiconductor package according to some embodiments. Referring to FIGS. 1 and 13, the semiconductor chip 20 may be fabricated (in S10). The semiconductor chip 20 may be fabricated by a wafer process, a back-end process, a sawing process, and/or other processes. In the wafer process, electronic devices, such as transistor, capacitor, resistor, diode, or the like, may be integrated on a wafer. The electronic devices may include at least one of a semiconductor wafer (not shown), metal layers, interlayered insulating layers, and or other layers. The wafer process may include several unit processes, such as ion-implantation, deposition, photolithography, and etching processes. In the ion implantation process, a semiconductor wafer or a layer on the semiconductor wafer may be doped with impurities. In the deposition process, a metal or interlayered insulating layer may be formed. The metal or interlayered insulating layer may be formed by a sputtering process or a chemical vapor deposition (CVD) process. In the photolithography process, a photoresist pattern may be formed on the semiconductor wafer, the metal layer, and the interlayered insulating layer. In the etching process, the semiconductor substrate, the metal layer, and the interlayered insulating layer exposed by the photoresist pattern may be partially removed. In the back-end process, metal lines connecting the electronic devices may be formed. The metal lines may be electrically separated from each other by the interlayered insulating layer. In the sawing process, the semiconductor wafer may be separated into a plurality of the semiconductor chips 20. Each of the semiconductor chips 20 may be shaped like a rectangle.

Next, the semiconductor chip 20 may be mounted on the printed circuit board 10 (in S20). The semiconductor chip 20 may be mounted on the printed circuit board 10 by a die attaching process and a die bonding process. In the die attaching process, the semiconductor chip 20 may be attached to a top surface of the printed circuit board 10. In the die bonding process, the bonding wires 16 connecting the semiconductor chip 20 electrically to the printed circuit board 10 may be formed. After the die attaching process or the die bonding process, the under-fill epoxy 14 may be formed between the printed circuit board 10 and the semiconductor chip 20.

Thereafter, the mold layer 30 may be formed on the printed circuit board 10 and the semiconductor chip 20 (in S30). The mold layer 30 may be formed by a compression molding method, an extrusion molding method, or other molding techniques. In the compression molding method, a polymer compound melted in a mold may be compressively provided on the printed circuit board 10 and the semiconductor chip 20. In the extrusion molding method, the printed circuit board 10 and the semiconductor chip 20 may be loaded in a mold, and thereafter, a polymer compound heated at the outside may be provided in the mold.

A surface of the mold layer 30 may be cleaned using a plasma reaction (in S40). In the plasma reaction, the surface of the mold layer 30 may be treated by negatively-charged electrons or positively-charged ions. The surface of the mold layer 30 may be melted during the plasma reaction.

Thereafter, the marking 40 may be printed on the mold layer 30 (in S50). The marking 40 may be formed by an ink-jet method. For example, the ink-jet method may be performed using a printer having a resolution of about 720×1440 dpi. The printer may be configured to drop ink of about 12 pl or less on the surface of the mold layer 30. The dropped ink may form the dot markings 42. The dot markings 42 may be printed to have or fill an effective area ratio ranging from ½ to ¼, in the unit display region 34 of the mold layer 30.

Next, a thermal curing may be performed to the marking 40 (in S60). The thermal curing may be performed at a temperature of about 150 to about 180° C. for a heating time ranging from several ten minutes to several hours.

According to the afore-described embodiments, the semiconductor package may include the semiconductor chip 20 mounted on the printed circuit board 10. However, some embodiments may not be limited thereto. For example, the semiconductor package may include wafer-level semiconductor chips 20. According to the afore-described embodiments, the semiconductor chip 20 may be singly provided in the semiconductor package. However, some embodiments may not be limited thereto. For example, the semiconductor package may include a plurality of semiconductor chips 20.

Figure 14:
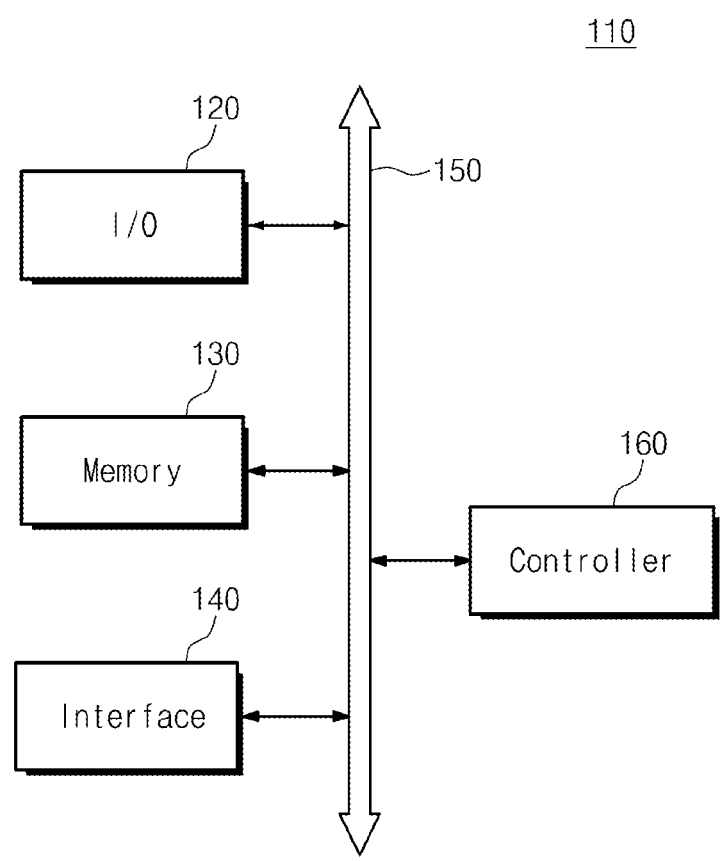
FIG. 14 is a block diagram illustrating an example of an electronic system including a semiconductor package according to some embodiments

FIG. 14 is a block diagram illustrating an example of an electronic system including a semiconductor package according to some embodiments. An electronic system 110 may include a controller 160, an input-output unit 120, a memory device 130, an interface 140, and a bus 150. The controller 160, the input-output unit 120, the memory device 130, and/or the interface 140 may be connected to each other via the bus 150 serving as an electric pathway for data transmission. In some embodiments, at least one of the controller 160, the input-output unit 120, the memory device 130, and/or the interface 140 may be configured to include the semiconductor package according to some embodiments.

The controller 160 may include at least one of a microprocessor, a digital signal processor, a microcontroller, or other logic devices having a similar function to any one of the microprocessor, the digital signal processor and the microcontroller. The input-output unit 120 may include a keypad, a keyboard, and/or a display unit, or other similar devices. The memory device 130 may be configured to store data and/or commands. The interface unit 140 may be configured to transmit electrical data to a communication network or may be configured to receive electrical data from a communication network. The interface unit 140 may be configured to operate by wireless or cable. For example, the interface unit 140 may include an antenna for wireless communication and/or a transceiver for cable communication. Although not shown in the drawings, the electronic device 100 may further include a fast DRAM device and/or a fast SRAM device which acts as a cache memory for improving an operation of the controller 110. At least the controller 110, the I/O unit 120, and the memory device 130 may include the semiconductor devices according to the aforementioned embodiments.

The electronic system 110 may be applied to a personal digital assistant (PDA), a portable computer, a web tablet, a wireless phone, a mobile phone, a digital music player, a memory card or other electronic products. The other electronic products may receive or transmit information data by wireless communications.

Figure 15:
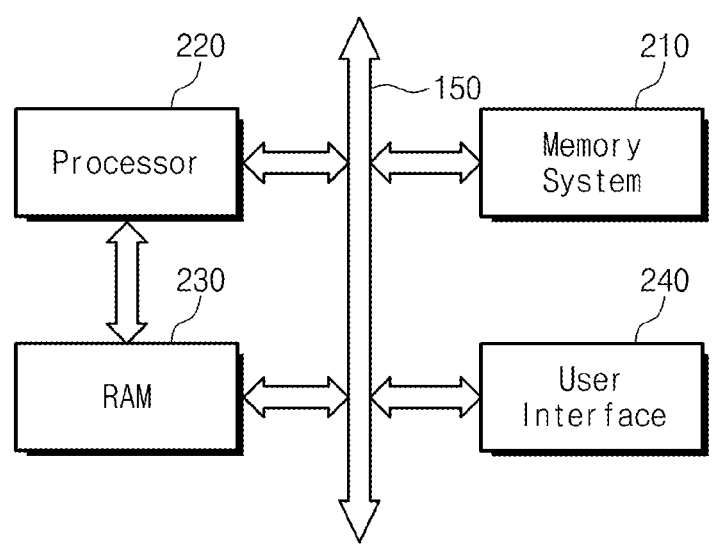
FIG. 15 is a schematic block diagram illustrating another example of an electronic system including a semiconductor package according to some embodiments.

FIG. 15 is a schematic block diagram illustrating another example of an electronic system including a semiconductor package according to embodiments. Referring to FIG. 15, an electronic system 115 may include at least one of the semiconductor packages according to the embodiments mentioned above. The electronic system 115 may include a mobile device or a computer. As an illustration, the electronic system 115 may include a memory system 210, a processor 220, a random access memory (RAM) 230, and a user interface 240 that that are electrically connected to a bus 150. The processor 220 may be configured to execute programs and control the electronic system 115. The RAM 230 may be used as an operating memory of the processor 220. For example, all or each of the processor 220 and the RAM 230 may include the semiconductor device according to some embodiments. Alternatively, the processor 220 and the RAM 230 may be provided as components of a semiconductor package. The user interface 240 may be used to input/output data to/from the electronic system 115. The memory system 210 may be configured to store code for operating the processor 220, data processed by the processor 220 or data inputted from the outside. The memory system 210 may include a controller and a memory device, and it may be configured to have substantially the same features as the memory device 130 of FIG. 14.

The electronic system 115 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 115 performs wireless communication, the electronic system 115 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

According to some embodiments, the semiconductor package may include a semiconductor chip, a mold layer, and a marking. The semiconductor chip may be protected by the mold layer. For example, the mold layer may be formed to cover the semiconductor chip. The marking may be formed on a surface of the mold layer to display information on a manufacturer, a lot number, or a product number of the semiconductor chip. The marking may include a display region, in which a plurality of regularly-arranged dot markings are provided. The dot markings may be provided to fill a region, whose area ranges from ½ to ¼ of the display region. Although the dot markings has an effective area ranging from ½ to ¼, the display region can have visibility similar to that of a stocked display region (e.g., with an effective area ratio of 100%). The dot markings may not be overlapped with each other in the display region having such a small effective area. Accordingly, it is possible to reduce a variation in thickness of the marking.

As described above, the ratio of effective area of dot markings may be less than about ½. In an embodiment, this ratio may be the ratio in a unit display region that has the highest density of dot markings. Accordingly, the ratio of effective area may vary from a maximum of about ½ in a relatively concentrated region to about 0 in a blank region. Moreover, to change the shade of the markings, less dot markings may be deposited within a unit display region than those described above.

Although unit display regions have been described above in diamond or square areas, in other embodiments, the unit display regions may have different and/or irregular shapes. Moreover, in other embodiments, within a display region, multiple different unit display regions may be used.

As a result, in the semiconductor package according to some embodiments, the marking can have high visibility and a reduced thickness variation.

Some embodiments provide a semiconductor package with highly visible markings and a method of fabricating the same.

Some embodiments provide a semiconductor package including markings configured to have a reduced thickness variation and a method of fabricating the same.

According to some embodiments, a semiconductor package may include a semiconductor substrate, a mold layer on the semiconductor substrate, and a marking formed on a surface of the mold layer to display a letter or trademark corresponding to information on the semiconductor substrate, the marking including dot markings discontinuously arranged in vertical and horizontal directions. The dot markings may be provided to have or fill an effective area that may be smaller than half a total area of a display region of the letter or the trademark.

In some embodiments, the dot markings may be continuously arranged along a diagonal direction of the display region.

In some embodiments, the display region may include dot regions, in which the dot markings may be provided, and non-dot regions, in which the dot markings may be not provided, each of the non-dot regions having the same area as that of the dot region. The dot markings may be alternatingly arranged in the vertical and horizontal directions, thereby forming a plaid shape in the dot region of the display region.

In some embodiments, the display region may include a plurality of the unit display regions, and the dot regions may be continuously provided along the diagonal directions of each of the unit display regions, such that each of the unit display regions has a diamond shape.

In some embodiments, the diamond-shaped unit display region may include seven dot regions continuously provided along each of the diagonal directions and have an effective area ranging from about 38 percent to about 49 percent.

In some embodiments, the diamond-shaped unit display region may include five dot regions continuously provided along each of the diagonal directions and have an effective area ranging from about 38 percent to about 47 percent.

In some embodiments, the diamond-shaped unit display region may include three dot regions continuously provided along each of the diagonal directions and have an effective area of about 38 percent.

In some embodiments, the dot markings in the diamond-shaped unit display region may be discontinuously provided along the diagonal direction.

In some embodiments, the dot markings may be discontinuously provided along a diagonal direction of the unit display region.

In some embodiments, the dot regions have an effective area of about 25 percent in the unit display region.

In some embodiments, each of the dot markings may be shaped like a square, a circle, or a polygon.

According to some embodiments, a method of fabricating a semiconductor package may include performing a wafer-level process to a semiconductor substrate, forming a mold layer on the semiconductor substrate, and printing dot markings on the mold layer. The dot markings may be printed using an ink-jet printing method and have an effective area that may be smaller than half a total area of a unit display region.

In some embodiments, each of the dot markings may be printed with an amount of about 12 pl or less.

In some embodiments, the method may further include performing a plasma-treatment cleaning process to the mold layer, before the printing of the dot markings.

In some embodiments, the method may further include a thermal curing to the dot markings.

While some embodiments have been particularly shown and described, it will be understood by one of ordinary skill in the art that variations in form and detail may be made therein without departing from the spirit and scope of the attached claims.

What is claimed is:

1. A semiconductor package, comprising:
    a semiconductor substrate;
    a mold layer on the semiconductor substrate; and
    a marking formed on a surface of the mold layer, the marking comprising dot markings substantially discontinuously arranged in vertical and horizontal directions of a display region;
    wherein an effective area of the dot markings within a unit display region of the marking is smaller than about half a total area of the unit display region.

2. The semiconductor package of claim 1, wherein the dot markings are substantially continuously arranged along a diagonal direction of the display region.

3. The semiconductor package of claim 1, wherein the display region comprises:
    dot regions in which the dot markings are provided; and
    non-dot regions in which the dot markings are not provided, each of the non-dot regions having substantially a same area as that of the dot region;
    wherein the dot regions and non-dot regions are alternatingly arranged in the vertical and horizontal directions.

4. The semiconductor package of claim 3, wherein:
    the unit display region has a diamond shape; and
    the dot regions are substantially continuously provided along diagonal directions of the unit display region.

5. The semiconductor package of claim 3, wherein:
    the unit display region includes seven dot regions substantially continuously provided along each diagonal direction; and
    the effective area is between about 38 percent to about 49 percent of the total area of the unit display region.

6. The semiconductor package of claim 3, wherein:
    the unit display region includes five dot regions substantially continuously provided along each diagonal direction; and
    the effective area is between about 38 percent to about 47 percent of the total area of the unit display region.

7. The semiconductor package of claim 3, wherein:
    the unit display region includes three dot regions substantially continuously provided along each diagonal direction; and
    the effective area is between about 38 percent of the total area of the unit display region.

8. The semiconductor package of claim 3, wherein the dot regions in the unit display region are discontinuously provided along a diagonal direction.

9. The semiconductor package of claim 3, wherein the dot regions have an effective area of 25 percent in the unit display region.

10. The semiconductor package of claim 1, wherein a shape of each of the dot markings is a square, a circle, or a polygon.

11. The semiconductor package of claim 1, wherein the marking includes at least one of a letter, symbol, and a trademark.

12. A method of fabricating a semiconductor package, comprising: printing dot markings of a marking on a mold layer on a semiconductor substrate;
    wherein the dot markings in a unit display region within the marking have an effective area that is smaller than about half a total area of the unit display region.

13. The method of claim 12, wherein each of the dot markings is deposited with an amount of 12 pico-liter or less.

14. The method of claim 12, further comprising performing a plasma-treatment cleaning process to the mold layer before the printing of the dot markings.

15. The method of claim 12, further comprising thermally curing the dot markings.

16. The method of claim 12, wherein printing the dot markings comprises printing the dot markings using an ink-jet printing method.

17. A semiconductor package, comprising:
    a semiconductor substrate;
    a mold layer formed on the semiconductor substrate; and
    a display region on the mold layer including a marking formed of dot markings;
    wherein:
        the display region includes dot regions and non-dot regions;
        the dot markings of the marking are formed outside of the non-dot regions; and
        a ratio of an effective area of the dot regions within a unit display region of the display region to an area of the unit display region is less than about one half.

18. The semiconductor package of claim 17, wherein the dot markings of the marking are disposed such that a greatest contact between adjacent dot markings is substantially a point contact.

19. The semiconductor package of claim 17, wherein the dot regions and the non-dot regions alternate in first and second orthogonal directions of the display region.

20. The semiconductor package of claim 19, wherein within the unit display region, along the first direction, the display region includes at least two non-dot regions disposed substantially continuously.

* * * * *